US010697836B2

(12) United States Patent
Lee et al.

(10) Patent No.: US 10,697,836 B2
(45) Date of Patent: Jun. 30, 2020

(54) SYSTEM AND METHOD FOR MEASURING JUNCTION TEMPERATURE OF POWER MODULE

(71) Applicants: Hyundai Motor Company, Seoul (KR); Kia Motors Corporation, Seoul (KR)

(72) Inventors: Je Hwan Lee, Gyeonggi-Do (KR); Han Geun Jang, Seoul (KR); Seong Min Lee, Gyeonggi-Do (KR); Sang Cheol Shin, Gyeonggi-do (KR); Heon Young Kwak, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 339 days.

(21) Appl. No.: 15/644,354

(22) Filed: Jul. 7, 2017

(65) Prior Publication Data
US 2018/0172522 A1   Jun. 21, 2018

(30) Foreign Application Priority Data
Dec. 15, 2016   (KR) .................. 10-2016-0171556

(51) Int. Cl.
*G01K 7/01* (2006.01)
*H03K 17/082* (2006.01)
*G01R 31/42* (2006.01)
*G01R 31/26* (2020.01)
*H03K 17/08* (2006.01)

(52) U.S. Cl.
CPC .......... *G01K 7/01* (2013.01); *G01R 31/2619* (2013.01); *G01R 31/42* (2013.01); *H03K 17/0828* (2013.01); *G01K 2217/00* (2013.01); *G01R 31/2642* (2013.01); *H03K 2017/0806* (2013.01); *H03K 2217/0027* (2013.01)

(58) Field of Classification Search
CPC .............. H01L 2924/1305; G01K 7/01; G01N 2033/0095; G01R 31/2619
See application file for complete search history.

(56) References Cited

U.S. PATENT DOCUMENTS

| 5,383,083 A | * | 1/1995 | Shinoda | H03F 1/52 361/103 |
| 6,203,191 B1 | * | 3/2001 | Mongan | G01K 7/42 374/20 |
| 6,806,772 B2 | * | 10/2004 | Glaser | H03F 3/189 330/289 |
| 7,061,740 B2 | * | 6/2006 | Mendenhall | H03F 1/52 326/112 |

(Continued)

FOREIGN PATENT DOCUMENTS

| KR | 20140047758 | 4/2014 |
| KR | 10-1567256 B1 | 11/2015 |

*Primary Examiner* — Gail Kaplan Verbitsky
(74) *Attorney, Agent, or Firm* — Mintz Levin Cohn Ferris Glovsky and Popeo, P.C.; Peter F. Corless

(57) ABSTRACT

A system and method for measuring a junction temperature of a power module junction temperature are provided. The method is capable of improving accuracy of temperature measurement by more accurately applying temperature change in a junction temperature rising section, capable of more accurately predicting durability life of a power module, and capable of increasing output power of the power module.

9 Claims, 6 Drawing Sheets

(56) References Cited

U.S. PATENT DOCUMENTS

| | | | | |
|---|---|---|---|---|
| 7,126,387 | B2* | 10/2006 | Nair | H02M 3/1588 |
| | | | | 327/108 |
| 8,057,094 | B2* | 11/2011 | Luniewski | H01L 23/34 |
| | | | | 257/467 |
| 9,035,689 | B2* | 5/2015 | Bhangu | H03K 17/145 |
| | | | | 327/378 |
| 9,130,028 | B2* | 9/2015 | Bunin | H01L 29/42316 |
| 9,508,633 | B2* | 11/2016 | Herbsommer | H01L 23/49524 |
| 9,728,580 | B2* | 8/2017 | Meiser | H01L 27/16 |
| 9,927,483 | B2* | 3/2018 | Bohllander | G01R 31/2603 |
| 10,240,983 | B2* | 3/2019 | Son | G01K 7/01 |
| 2004/0131104 | A1* | 7/2004 | Seferian | G01K 7/01 |
| | | | | 374/178 |
| 2017/0294838 | A1* | 10/2017 | Kobayashi | H02J 7/0072 |
| 2018/0034358 | A1* | 2/2018 | Geske | H02M 1/08 |

* cited by examiner

SYSTEM AND METHOD FOR MEASURING JUNCTION TEMPERATURE OF POWER MODULE

CROSS REFERENCE TO RELATED APPLICATION

The present application claims priority to Korean Patent Application No. 10-2016-0171556, filed Dec. 15, 2016, the entire contents of which is incorporated herein for all purposes by this reference.

BACKGROUND

Field of the Invention

The present invention relates generally to a system and method for measuring a junction temperature of a power module, and more particularly, to a system and method for measuring a junction temperature of a power module junction temperature, and improving the accuracy of temperature measurement by more accurately applying temperature change in a junction temperature increase section, more accurately predicting durability life of a power module, and increasing output power of the power module.

Description of the Related Art

Generally, to drive a motor, an inverter is required for generating an alternating current (AC) by converting a direct current (DC). The inverter includes a power module having a power semiconductor device, such as an insulated gate bipolar mode transistor (IGBT) or a diode that performs a switching operation. The power semiconductor devices of the power module should be managed within a predetermined maximum allowable temperature to prevent burning and maintain durability life thereof.

Accordingly, the power module includes a negative temperature coefficient (NTC) thermistor configured to detect a junction temperature that is a temperature of the power semiconductor device. However, a method for estimating a junction temperature using the NTC is problematic in that since the method does not compensate for changes in an input voltage of the inverter and a switching frequency of the power semiconductor device and thus, it may be impossible to accurately predict a junction temperature. Particularly, since the NTC detects voltage change using heat generated from the power semiconductor device when a junction temperature increases, thermal impedance is significantly different from the power semiconductor device.

As described above, other than the method for estimating a junction temperature using the NTC, a method for estimating a junction temperature using a thermal model has been developed. The method using the thermal model is a method for estimating a junction temperature based on power loss in consideration of a voltage, a current, and a switching frequency of the power semiconductor device. The method is capable of more accurately estimating a junction temperature than the method using the NTC. However, since a junction temperature has a particular temperature increase trend in the process of increasing to a saturation temperature, the temperature increase trend should be accurately reflected to accurately predict a junction temperature of the power module in motion.

The foregoing is intended merely to aid in the understanding of the background of the present invention, and is not intended to mean that the present invention falls within the purview of the related art that is already known to those skilled in the art.

SUMMARY

Accordingly, the present invention provides a system and method for measuring a junction temperature of a power module junction temperature. The system and method are capable of improving the accuracy of temperature measurement by more accurately applying temperature change in a junction temperature increasing section, capable of more accurately predicting durability life of a power module, and capable of increasing output power of the power module.

According to one aspect of the present invention, a method for measuring a junction temperature of a power module, in which the power module includes a plurality of power semiconductor devices may include: calculating a predicted temperature change value of a first power semiconductor device, based on power loss and thermal resistance of the first power semiconductor device subjected to junction temperature measurement; and calculating a predicted temperature change value of a second power semiconductor device disposed proximate to the first power semiconductor device, based on power loss and thermal resistance of the second power semiconductor device.

The method may further include applying a first time constant to the predicted temperature change value of the first power semiconductor device, and applying a second time constant having a value greater than the first time constant to the predicted temperature change value of the second power semiconductor device; and deriving a final junction temperature of the first power semiconductor device, by combining the predicted temperature change value of the first power semiconductor device applied with the first time constant, and the predicted temperature change value of the second power semiconductor device applied with the second time constant.

The calculating of the predicted temperature change value of the first power semiconductor device may further include: calculating the power loss of the first power semiconductor device, based on an input voltage, an input current, and a switching frequency thereof; and deriving the predicted temperature change value of the first power semiconductor device by multiplying the thermal resistance thereof with the power loss thereof. Additionally, the calculating of the predicted temperature change value of the second power semiconductor device may include: calculating the power loss of the second power semiconductor device, based on an input voltage, an input current, and a switching frequency thereof; and deriving the predicted temperature change value of the second power semiconductor device by multiplying the thermal resistance thereof with the power loss thereof.

The thermal resistance of the first power semiconductor device may have a value predetermined based on a flow rate of a coolant that flows in a coolant passage indisposed within the power module. In addition, the thermal resistance of the second power semiconductor device may have a value predetermined based on a flow rate of a coolant that flows in a coolant passage disposed within the power module. The deriving of the final junction temperature may be performed by summing the predicted temperature change value of the first power semiconductor device applied with the first time constant, and the predicted temperature change value of the second power semiconductor device applied with the second time constant, and by summing the summed value and a temperature of a coolant that flows in a coolant passage disposed within the power module, thereby deriving the final junction temperature.

According to another aspect of the present invention, a method for measuring a junction temperature of a power module, in which the power module includes a plurality of power semiconductor devices may include determining an increase trend of a junction temperature of a first power semiconductor device by combining an increase trend of a predicted temperature change value caused by heat generation of the first power semiconductor device subjected to junction temperature measurement, and an increase trend of temperature change caused by heat generation of a second power semiconductor device disposed near the first power semiconductor device.

According to the method for measuring a junction temperature of a power module, it may be possible to improve accuracy of junction temperature by reflecting a junction temperature increase trend differently based on a driving condition of a vehicle. Particularly, the present invention may improve accuracy of junction temperature while the vehicle is being driven by applying influence of heat generation of the proximate power semiconductor device based on a driving condition of the vehicle.

According to the method for measuring a junction temperature of a power module, it may be possible to more accurately predict a junction temperature of a power module, to thus more accurately predict durability life of the power module to temperature stress. According to the method for measuring a junction temperature of a power module, it may further be possible to more accurately predict a junction temperature of a power module, to operate temperature derating logic of the power module at a desired temperature and thus reduce loss of output caused by excessive temperature derating logic.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION

Figure 1:
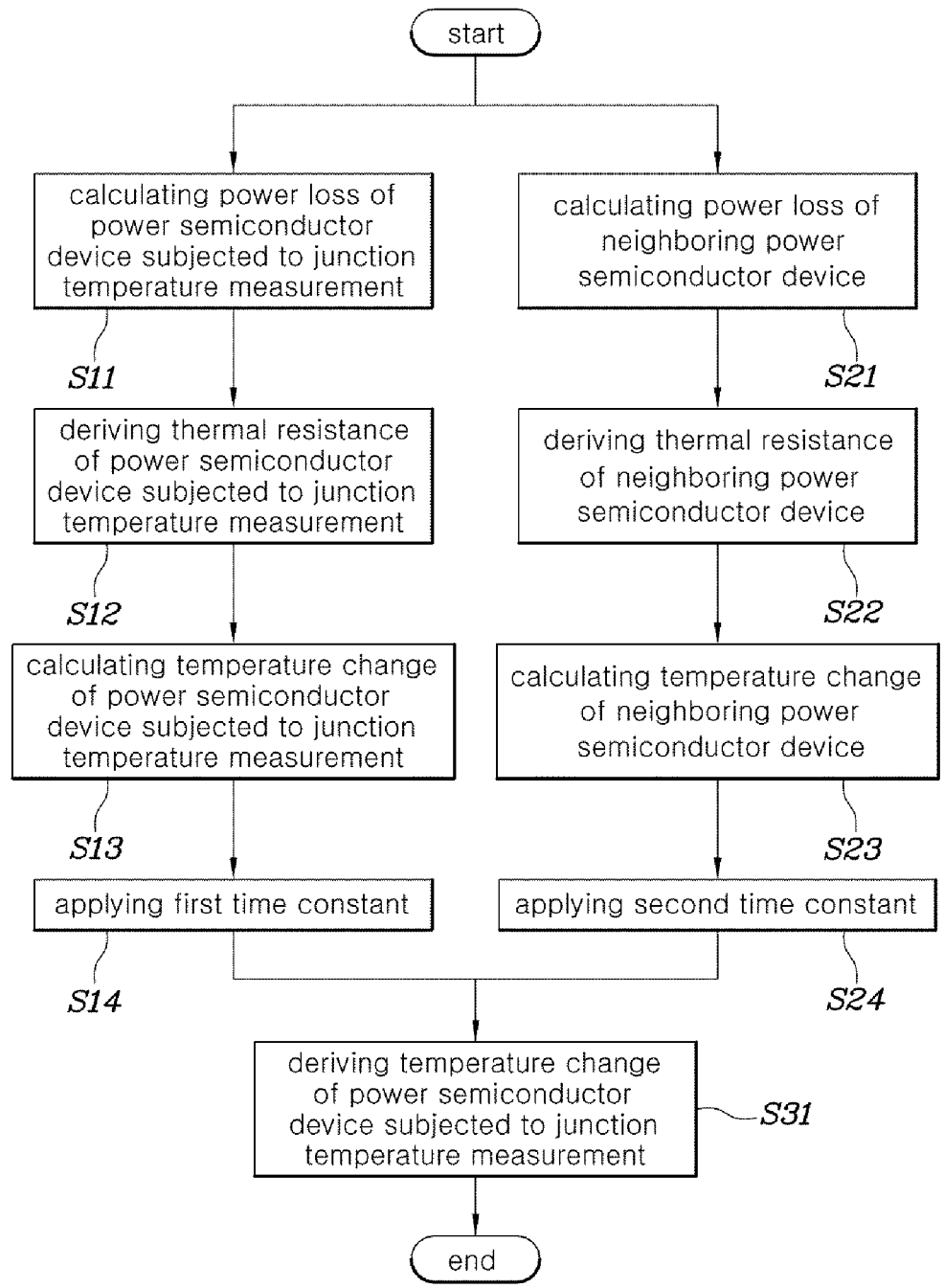
FIG. 1 is a flow chart showing a method for measuring a junction temperature of a power module according to an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/of" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinbelow, exemplary embodiments of the present invention will be described in detail with reference to the accompanying drawings. Throughout the drawings, the same reference numerals will refer to the same or like parts.

FIG. 1 is a flow chart showing a method for measuring a junction temperature of a power module according to an exemplary embodiment of the present invention. The method to be described herein below may be executed by a controller having a processor and a memory. Referring to FIG. 1, a method for measuring a junction temperature of a power module according to an exemplary embodiment of the present invention, in which the power module includes a plurality of power semiconductor devices, may include: calculating a predicted temperature change value of a power semiconductor device subjected to junction temperature measurement, based on power loss calculated based on an input voltage, an input current, and a switching frequency of the power semiconductor device, and thermal resistance of the power semiconductor device (S11-S13. A predicted temperature change value of a neighboring power semiconductor device adjacent to the power semiconductor device may then be calculated based on power loss calculated based on an input voltage, an input current, and a switching frequency of the neighboring power semiconductor device, and the thermal resistance of the power semiconductor device (S21-S23).

The method may further include applying a first time constant to the predicted temperature change value of the power semiconductor device, and applying a second time constant having a value greater than the first time constant to the predicted temperature change value of the neighboring power semiconductor device (S14, S24); and deriving a final junction temperature of the power semiconductor device, by combining the predicted temperature change value of the power semiconductor device applied with the first time constant, and the predicted temperature change value of the neighboring power semiconductor device applied with the second time constant (S31).

Figure 2:
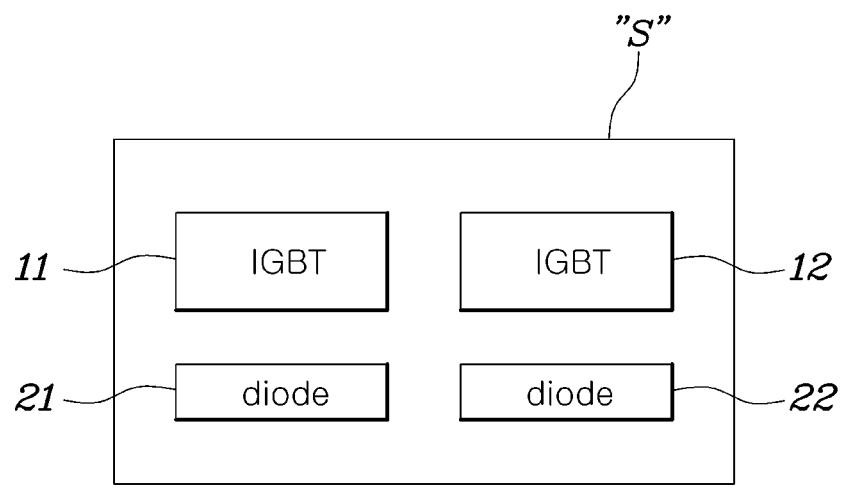
FIGS. 2 and 3 are a plan view and a side sectional view showing an example of a power module, to which a method for measuring a junction temperature of a power module according to an exemplary embodiment of the present invention is applied.
Figure 3:
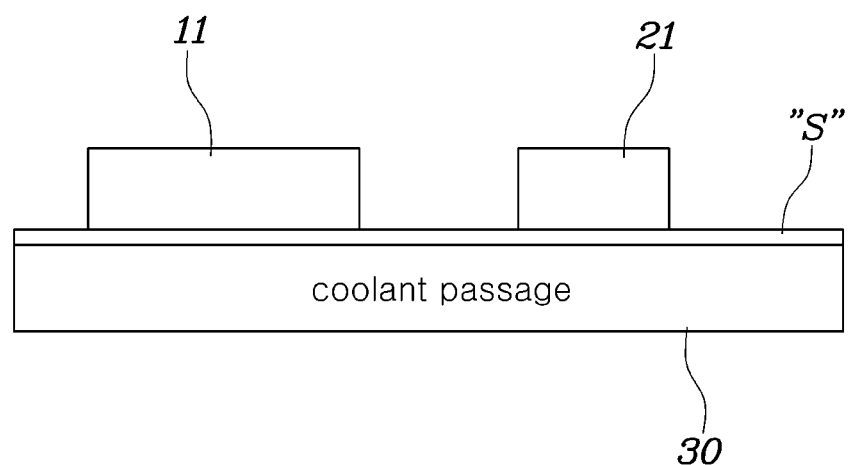

As described above, the method, as shown FIGS. 2 and 3, may be applied to the power module having a plurality of power semiconductor devices. FIGS. 2 and 3 are a plan view and a side sectional view showing an example of a power module, to which a method for measuring a junction temperature of a power module according to an exemplar embodiment of the present invention is applied.

As shown in FIGS. 2 and 3, the power module may include a plurality of insulated gate bipolar mode transistors (IGBTs) 11 and 12, and diodes 21 and 22 disposed on a substrate S. Not shown in FIGS. 2 and 3, the IGBTs 11 and 12, and the diodes 21 and 22 may be electrically connected by a power line realized by a conductive pattern formed on the substrate S, and a wire configured to transmit a control signal may be connected to the IGBTs 11 and 12, and the diodes 21 and 22. Further, the power module may include a coolant passage 30 at a lower portion of the substrate S to be in contact with the substrate S. A coolant may flow in the coolant passage 30 to cool the power semiconductor devices 11, 12, 21, and 22. In FIG. 3, one coolant passage 30 may be disposed at the lower portion of the substrate S, but is not limited thereto, since a variety coolant passage structures are well known in the art. A flow rate and a temperature of the coolant that flows in the coolant passage 30 may be used to predict a junction temperature, which will be described hereinafter.

In the power module having the above described structure, a junction temperature of a power semiconductor device, for example, an IGBT 11, may increase due to heat generated by a current and switching thereof, but may be influenced by heat generated by other IGBT 12 and diodes 21 and 22. The method may include estimating a junction temperature by considering both heat generation of a power semiconductor device itself, and influence by heat generation of a neighboring power semiconductor device based on a driving mode or a driving condition, and particularly, an increase trend of the junction temperature may be more accurately reflected.

Figure 4:
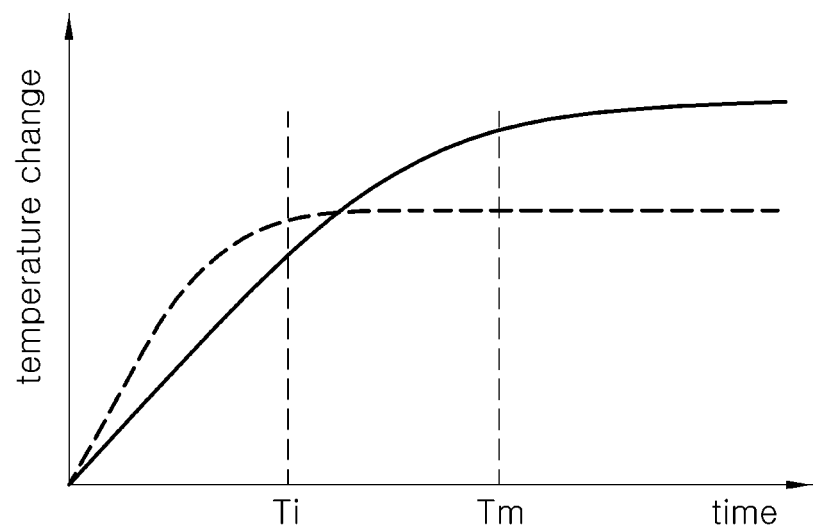
FIG. 4 is a graph showing the comparison of junction temperature change when single power semiconductor device is operated, and junction temperature change of one power semiconductor device when a plurality of power semiconductor devices are operated, to illustrate a concept of a method for measuring a junction temperature of a power module according to an exemplary embodiment of the present invention.

FIG. 4 is a graph showing the comparison of junction temperature change when a single power semiconductor device is operated, and junction temperature change of one power semiconductor device when a plurality of power semiconductor devices are operated to illustrate a concept of a method for measuring a junction temperature of a power module according to an exemplary embodiment of the present invention. In FIG. 4, a dotted curved line illustrates a result obtained by experimentally measuring junction temperature change of the single power semiconductor device after a current is applied thereto when a single power semiconductor device is operated; and a solid curved line illustrates a result obtained by experimentally measuring junction temperature change of one power semiconductor device after a current is applied to the plurality of power semiconductor devices when power semiconductor devices adjacent to each other are operated together.

As shown by a dotted line in FIG. 4, when operating a single power semiconductor device, at the point labeled 'Ti', the junction temperature enters a saturation region. However, when operating a plurality of power semiconductor devices, a time when the junction temperature enters the saturation region is delayed by point 'Tm' by mutual influence, which is at a point in time later than when operating the single power semiconductor device. Additionally, a temperature of the saturation region is higher than when operating the single power semiconductor device. In other words, an increasing time constant of junction temperature change when the single power semiconductor device is operated is greater than that of junction temperature change when a plurality of power semiconductor devices are operated.

Based on the result as shown FIG. 4, whether the power semiconductor device in the power module is operated may be determined based on a driving mode or a driving condition of a vehicle, which should be considered to reflect the increase trend change of the junction temperature. For example, when a driving mode or a driving condition of a vehicle is a hill-hold condition (e.g., the vehicle is stopped on an inclined mad), the power module in an inverter may be operated by switching a pair of power semiconductor devices, to decrease the influence by heat generation of neighboring power semiconductor devices.

Furthermore, when a driving mode or a driving condition of a vehicle is a motoring condition, all the power semiconductor devices in the power module may be switched, thus increasing the influence for each device by heat generation of neighboring power semiconductor devices. Accordingly, during a hill-hold condition, a junction temperature may be measured by applying a temperature increase trend shown as a dotted line in FIG. 4, to reduce the reflection of the influence of neighboring power semiconductor devices. During a motoring condition, a junction temperature may be measured by applying a temperature increase trend shown as a solid line in FIG. 4, to further reflect the influence of neighboring power semiconductor devices.

Accordingly, in measuring a junction temperature of a power semiconductor device in the power module, different temperature increase trends may be applied to a predicted temperature change value caused by heat generation of a power semiconductor device subjected to junction temperature measurement, and a predicted temperature change value caused by heat generation of a neighboring power semiconductor device, that is, different time constants may be applied thereto. At the time when a current is applied to the power semiconductor device, it may thus be possible to more accurately predict a junction temperature in the increasing section before the junction temperature enters the saturation region.

Figure 5:
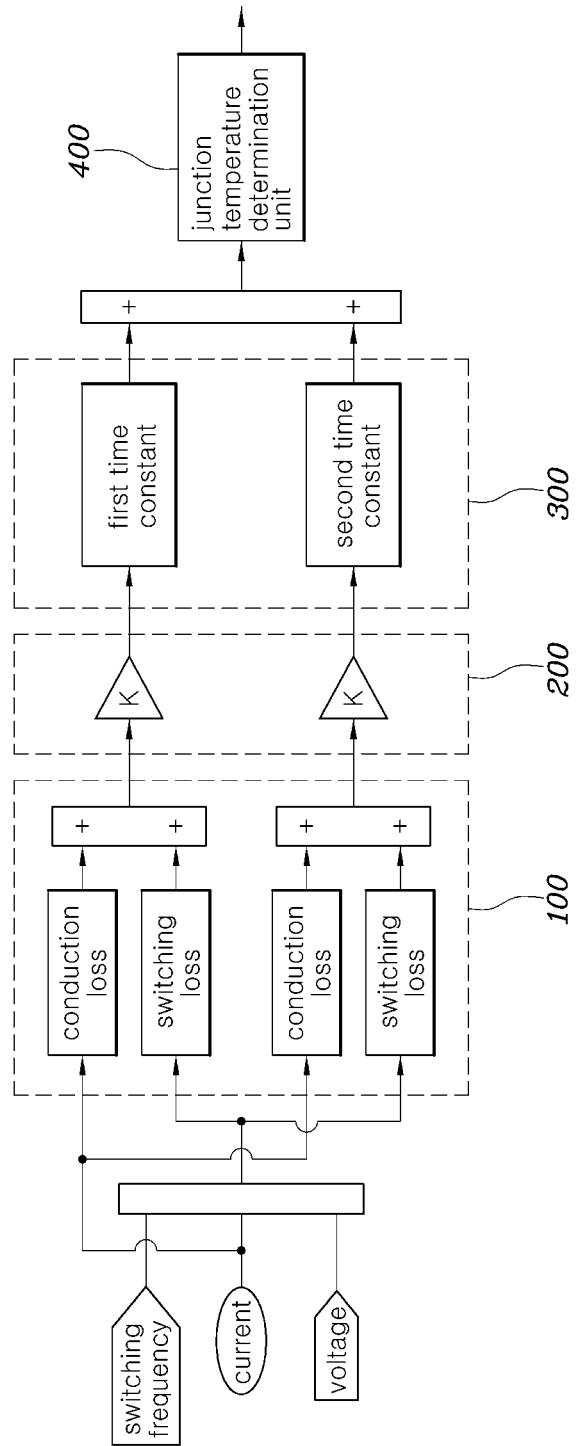
FIG. 5 is a diagram showing a controller executing a method for measuring a junction temperature of a power module according to an exemplary embodiment of the present invention.

FIG. 5 is a diagram showing a controller configured to execute a method for measuring a junction temperature of a power module according to an exemplary embodiment of the present invention. Operations and advantages of the method for measuring a junction temperature of a power module according to an exemplary embodiment of the present invention will be described in detail, with reference to FIGS. 1 and 5.

In particular, the controller may be configured to calculate each power loss in a power loss calculator 100 by receiving information regarding a voltage, a current, and a switching frequency input into the power semiconductor device subjected to junction temperature measurement, and information regarding a voltage, a current, and a switching frequency input into the neighboring power semiconductor device (S11 and S21). Herein, information regarding a voltage, a current, and a switching frequency may be received from an additional controller configured to operate the inverter.

An upper portion of the power loss calculator 100 of the controller shown in FIG. 5 may be configured to calculate power loss of the power semiconductor device subjected to junction temperature measurement, and a lower portion of the power loss calculator 100 of the controller may be configured to calculate power loss of the neighboring power semiconductor device. The power loss of each power semiconductor device may be divided into two conditions. The first condition being a conduction loss occurring in a current conduction situation and the second condition being a switching loss occurring in a switching conduction. Each loss may be calculated by a calculation formula of conduction loss and switching loss predetermined in advance. The calculation formula for calculating the power loss may be predetermined in consideration of various features based on an inverter provided within the power module, and the calculation formula may be determined in various ways according to power module manufacturers or automobile manufacturers using a power module, so a detailed description thereof will be omitted.

Furthermore, the power loss calculator 100 may be configured to output total power loss by summing the calculated conduction loss and switching loss of the power semiconductor device subjected to junction temperature measurement, and may be configured to output total power loss by summing the calculated conduction loss and switching loss of the neighboring power semiconductor device. Then, a thermal resistance application unit 200 of the controller may be configured to calculate temperature change of each power semiconductor device by respectively multiplying the power loss of the power semiconductor device subjected to junction temperature measurement with the power loss of the neighboring power semiconductor device calculated in the power loss calculator 100, and thermal resistance thereof (S12, S13, S22, and S23). The temperature change refers to a temperature increase of each power semiconductor device at the time when a current is applied to each power semiconductor device.

The thermal resistance of a power semiconductor device may be determined based on unique properties of the power module provided with the power semiconductor device and heat dissipation characteristics of a cooler. Accordingly, the thermal resistance of a power semiconductor device may be obtained in advance by an experimental method through a driving test along with an object receiving power (e.g., a motor), and the controller may be configured to store the thermal resistance derived by the experimental method in a database of a memory, whereby it may be possible to apply the thermal resistance to derive the temperature change.

To determine the thermal resistance in advance, a power module may be operated by applying predetermined input parameters thereof, whereby a temperature change value of a power semiconductor device in the power module may be obtained using a thermal camera, or the like. For example, when power loss occurs in each power semiconductor device, temperature of each power semiconductor device increases with properties of thermal resistance to a saturation condition. In particular, the temperature change value (e.g., a final temperature in the saturation condition, and a starting temperature before applying a current) may be identified using the thermal camera in the test.

Accordingly, a heat resistance value may be calculated through both a temperature change value of a power semiconductor device obtained using the thermal camera, and a power loss value obtained using the input parameters (e.g., a voltage, a current, and a switching frequency) of the power semiconductor device during the experiment. In other words, in experiments, the heat resistance value may be determined by dividing the temperature change value by the power loss calculated using the input parameters.

Meanwhile, a heat resistance value may vary based on heat dissipation characteristics, and thus, a flow rate of the coolant that flows in the coolant passage 30 described with reference to FIG. 3 should be reflected in determining the thermal resistance. Therefore, in the thermal resistance experiment, the thermal resistance measurement test based on application of the input parameters may be performed by changing a flow rate of the coolant (LPM: Liter Per Minute), and thus, it may be possible to derive a thermal resistance corresponding to each flow rate of the coolant.

Accordingly, the thermal resistance application unit 200 of the controller may be configured to calculate temperature changes of the power semiconductor device subjected to junction temperature measurement and the neighboring power semiconductor device (S13 and S23) by receiving information regarding the flow rate of the coolant that flows in the coolant passage from a flow meter or another controller (e.g., a subordinate controller) and by multiplying the derived thermal resistance with the power loss calculated in the step S11 after deriving thermal resistance that corresponds to the received flow rate of the coolant (S12 and S22).

Further, a time constant application unit 300 of the controller may be configured to apply a first time constant to the temperature change of the power semiconductor device subjected to junction temperature measurement calculated in the step S13, and apply a second time constant to the temperature change of the power semiconductor device subjected to junction temperature measurement calculated in the step S23 (S14 and S24). Herein, the second time constant may be set to have a value greater than the first time constant.

As described with reference to FIG. 4, in determining a junction temperature, influence of heat generation of the power semiconductor device subjected to junction temperature measurement itself may be reflected earlier than that of heat generation of the neighboring power semiconductor device. In other words, an increase of a junction temperature caused by heat generation of the power semiconductor device subjected to junction temperature measurement itself is more rapid than a temperature increase trend in consideration of heat generation of the neighboring power semiconductor device. Accordingly, the time constant application unit 300 may be configured such that the first time constant applied to the temperature change of the power semiconductor device subjected to junction temperature measurement is less than the second time constant applied to the temperature change of the neighboring power semiconductor device. The first time constant value and the second time constant value may be also determined by an experimental method.

Additionally, the controller may then be configured to derive a final junction temperature change of the power semiconductor device subjected to junction temperature measurement by combining the temperature change of the power semiconductor device subjected to junction temperature measurement applied with the first time constant, and the temperature change of the neighboring power semiconductor device applied with the second time constant (S31). In the step S31, the controller may be configured to finally determine the junction temperature of the power semiconductor device subjected to junction temperature measurement by summing the temperature change of the power semiconductor device subjected to junction temperature measurement applied with the first time constant, and the temperature change of the neighboring power semiconductor device applied with the second time constant, and by summing the summed value and a temperature of the coolant flowing in the coolant passage 30 in the junction temperature determination unit 400.

As described above, exemplary embodiments of the present invention are capable of more accurately reflecting influence of the neighboring power semiconductor device in the increasing section of a junction temperature by applying different time constants to a temperature increase caused by heat generation of the power semiconductor device subjected to junction temperature measurement, and to a temperature increase caused by heat generation of the neighboring power semiconductor device, thereby deriving a temperature change.

Figure 6:
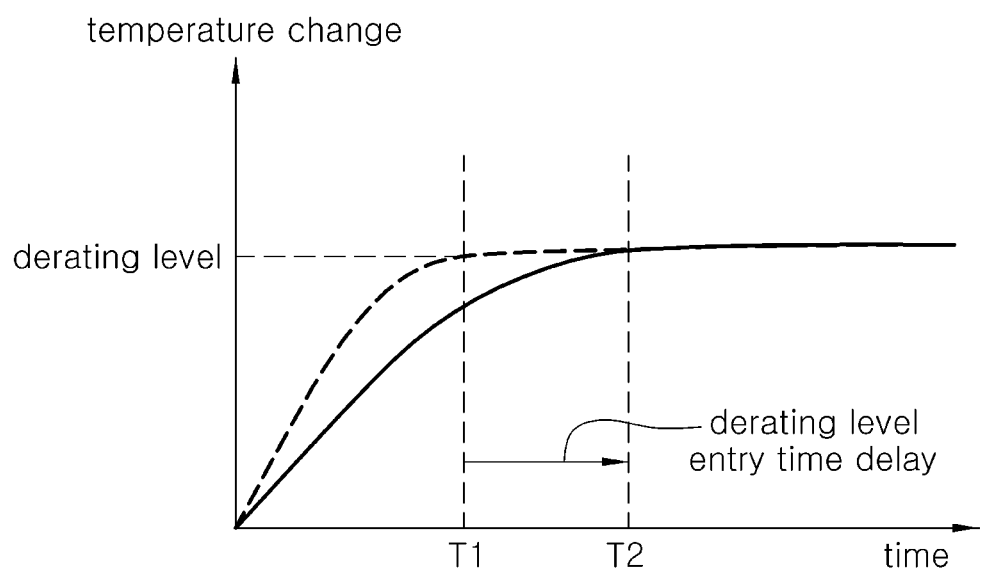
FIGS. 6 and 7 are graphs respectively showing a junction temperature change and amount of output of a power module according to whether a method for measuring a junction temperature of a power module according to an exemplary embodiment of the present invention is applied.
Figure 7:
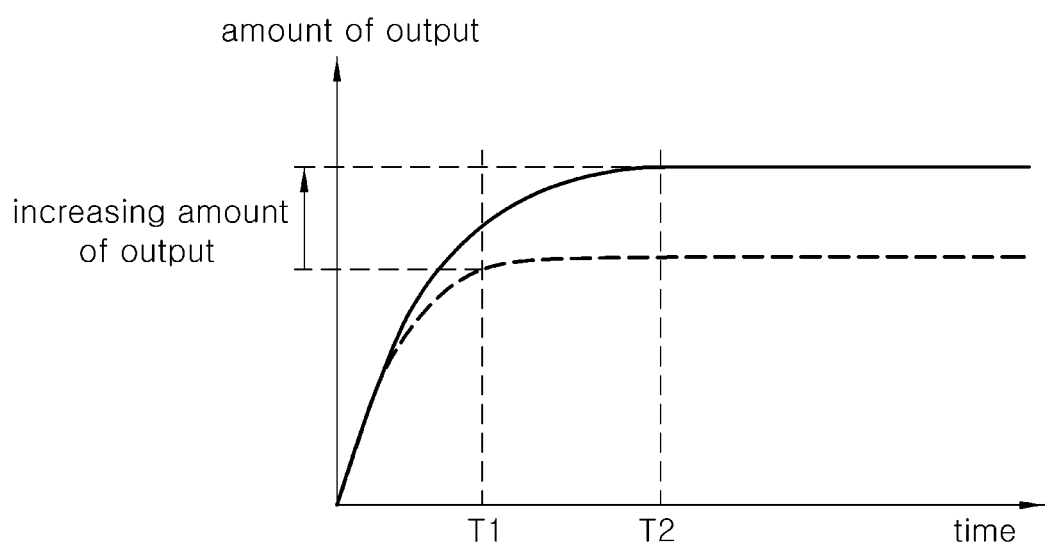

FIGS. 6 and 7 are graphs respectively showing a junction temperature change and an amount of output of a power module based on whether a method for measuring a junction temperature of a power module according to an exemplary embodiment of the present invention is applied. Dotted lines of FIGS. 6 and 7 illustrate when the method for measuring a junction temperature of a power module according to an exemplary embodiment of the present invention is not applied, that is, when only one time constant (e.g., the first time constant) is applied to a temperature change of the power semiconductor device subjected to junction temperature measurement, and a temperature change of the neighboring power semiconductor device. Additionally, solid lines illustrate when the method for measuring a junction temperature of a power module according to an exemplary embodiment of the present invention is applied.

As shown in FIG. 6, when applying one time constant, influence of heat generation of the neighboring power semiconductor device is reflected the same as influence of heat generation of the power semiconductor device subjected to junction temperature measurement, and thus, the predicted temperature change value rapidly increases to a derating level of a vehicle at point 'T1'. However, when applying the exemplary embodiment of the present invention, influence of heat generation of the neighboring power semiconductor device is applied with the second time constant that is greater than the first time constant, and thus, the temperature change value increases gradually, whereby the point where the temperature change value increases to the derating level is delayed by point 72'.

Accordingly, when applying the exemplary embodiment of the present invention, entry to the derating level that deteriorates dynamic performance of a vehicle may be delayed, and thus, a substantial amount of output of a vehicle may be secured as shown in FIG. 7. Particularly, as shown in FIG. 7, when applying one time constant, entry to the derating level may be performed at point 'T1', whereby it may be difficult to further increase the amount of output. However, when applying the exemplary embodiment of the present invention, entry to the derating level may be delayed 'T2' by point 'T2', it may be possible to increase the amount of output as much as the time gap.

As described above, the method for measuring a junction temperature according to the exemplary embodiment of the present invention junction temperature is capable of improving accuracy of junction temperature by differently reflecting junction temperature increase trend based on a driving condition or state of a vehicle. Particularly, the present invention is capable of improving accuracy of junction temperature during the drive by applying influence of heat generation of the neighboring power semiconductor device based on a driving condition of a vehicle.

Further, the method for measuring a junction temperature according to the exemplary embodiment of the present invention junction temperature is capable of more accurately predicting a junction temperature of a power module, whereby it may be possible to more accurately predict durability life of the power module to temperature stress. The method for measuring a junction temperature according to the exemplary embodiment of the present invention may also be capable of more accurately predicting a junction temperature of a power module, and thus, the temperature derating logic of the power module may be operated at a desired temperature, to reduce loss of output caused by excessive temperature derating logic.

Although an exemplary embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for measuring a junction temperature of a first power semiconductor device included in a power module, comprising;
    calculating, by a controller, a predicted temperature change value of the first power semiconductor device, based on a power loss and a predetermined thermal resistance of the first power semiconductor device subjected to junction temperature measurement using a sensor;
    calculating, by the controller, a predicted temperature change value of a second power semiconductor device disposed proximate to the first power semiconductor device, based on a power loss and a predetermined thermal resistance of the second power semiconductor device using the sensor;
    applying, by the controller, a predetermined first time constant to the predicted temperature change value of the first power semiconductor device, and applying a predetermined second time constant having a value greater than the first time constant to the predicted temperature change value of the second power semiconductor device;

deriving, by the controller, a final junction temperature of the first power semiconductor device, by combining the predicted temperature change value of the first power semiconductor device applied with the first time constant, and the predicted temperature change value of the second power semiconductor device applied with the second time constant; and increasing output of the first power semiconductor device, by the controller, the output being increased by applying the second time constant to delay entry to a derating level of the first power semiconductor device, the output being increased based on the final junction temperature.

2. The method of claim 1, wherein the calculating the predicted temperature change value of the first power semiconductor device includes:

calculating, by the controller, the power loss of the first power semiconductor device, based on an input voltage, an input current, and a switching frequency thereof; and deriving, by the controller, the predicted temperature change value of the first power semiconductor device by multiplying the thermal resistance thereof with the power loss thereof.

3. The method of claim 1, wherein the calculating the predicted temperature change value of the second power semiconductor device includes:

calculating, by the controller, the power loss of the second power semiconductor device, based on an input voltage, an input current, and a switching frequency thereof; and deriving, by the controller, the predicted temperature change value of the second power semiconductor device by multiplying the thermal resistance thereof with the power loss thereof.

4. The method of claim 2, wherein the power module includes a coolant passage in which a coolant flows so as to cool the first and second power semiconductor devices, and wherein the thermal resistance of the first power semiconductor device has a value predetermined based on a flow rate of the coolant flowing in the coolant passage within the power module.

5. The method of claim 3, wherein the power module includes a coolant passage in which a coolant flows so as to cool the first and second power semiconductor devices, and wherein the thermal resistance of the second power semiconductor device has a value predetermined based on a flow rate of the coolant flowing in the coolant passage within the power module.

6. The method of claim 1, wherein the power module includes a coolant passage in which a coolant flows so as to cool the first and second power semiconductor devices, and wherein the deriving of the final junction temperature is performed by summing the predicted temperature change value of the first power semiconductor device applied with the first time constant, and the predicted temperature change value of the second power semiconductor device applied with the second time constant, and by summing the summed value and a temperature of the coolant flowing in the coolant passage within the power module.

7. A system for measuring a junction temperature of a first power semiconductor device included in a power module, comprising;

a memory configured to store program instructions; and a processor configured to execute the program instructions, the program instructions when executed configured to:

calculate a predicted temperature change value of the first power semiconductor device, based on a power loss and a predetermined thermal resistance of the first power semiconductor device subjected to junction temperature measurement using a sensor;

calculate a predicted temperature change value of a second power semiconductor device disposed proximate to the first power semiconductor device, based on a power loss and a predetermined thermal resistance of the second power semiconductor device using the sensor;

supply a predetermined first time constant to the predicted temperature change value of the first power semiconductor device, and apply a predetermined second time constant having a value greater than the first time constant to the predicted temperature change value of the second power semiconductor device;

derive a final junction temperature of the first power semiconductor device, by combining the predicted temperature change value of the first power semiconductor device applied with the first time constant, and the predicted temperature change value of the second power semiconductor device applied with the second time constant; and increase output of the first power semiconductor device, the output being increased by applying the second time constant to delay entry to a derating level of the first power semiconductor device, the output being increased based on the final junction temperature.

8. The system of claim 7, wherein the program instructions that calculate the predicted temperature change value of the first power semiconductor device when executed are further configured to:

calculate the power loss of the first power semiconductor device, based on an input voltage, an input current, and a switching frequency thereof; and derive the predicted temperature change value of the first power semiconductor device by multiplying the thermal resistance thereof with the power loss thereof.

9. The system of claim 8, wherein the program instructions that calculate the predicted temperature change value of the second power semiconductor device when executed are further configured to:

calculate the power loss of the second power semiconductor device, based on an input voltage, an input current, and a switching frequency thereof; and derive the predicted temperature change value of the second power semiconductor device by multiplying the thermal resistance thereof with the power loss thereof.

* * * * *